United States Patent
Frederickson et al.

[19]

[11] Patent Number: 5,955,888
[45] Date of Patent: Sep. 21, 1999

[54] APPARATUS AND METHOD FOR TESTING BALL GRID ARRAY PACKAGED INTEGRATED CIRCUITS

[75] Inventors: Toby Alan Frederickson; Eric D. Hornchek, both of San Jose, Calif.

[73] Assignee: Xilinx, Inc., San Jose, Calif.

[21] Appl. No.: 08/926,559

[22] Filed: Sep. 10, 1997

[51] Int. Cl.$^6$ .............................. G01R 1/073; G01R 31/26
[52] U.S. Cl. ........................ 324/761; 324/754; 324/755; 324/758; 324/765; 439/700; 439/912
[58] Field of Search ..................................... 324/754, 755, 324/757, 758, 761, 765; 439/55, 70, 71, 78, 81, 83, 700, 912

[56] References Cited

U.S. PATENT DOCUMENTS

| | | | |
|---|---|---|---|
| 5,500,605 | 3/1996 | Chang | 324/758 |
| 5,518,410 | 5/1996 | Masami | 439/71 |
| 5,865,632 | 2/1999 | Iwasaki | 439/71 |

*Primary Examiner*—Glenn W. Brown
*Attorney, Agent, or Firm*—Patrick T. Bever; Edel M. Young

[57] ABSTRACT

An apparatus and method for testing ball grid array integrated circuits (BGA ICs) including a nesting member resiliently supported on a contactor body via guide shafts. The nesting member includes alignment walls and an alignment plate defining chamfered through-holes. The alignment wall is slanted to provide rough alignment of the IC within the nesting member, and fine alignment of the IC is achieved when the solder balls extending from the IC are received in the chamfers formed in the upper surface of the alignment plate. Spring-loaded pogo pins are mounted on a circuit board and have pointed tips extending toward a lower surface of the nesting member alignment plate. When the nesting member is pushed toward the circuit board by a device handler, the pointed tips of the pogo pins extend through the through-holes and pierce the solder balls of the IC, thereby providing electrical contact between the IC and the interface apparatus.

18 Claims, 9 Drawing Sheets

APPARATUS AND METHOD FOR TESTING BALL GRID ARRAY PACKAGED INTEGRATED CIRCUITS

FIELD OF THE INVENTION

The present invention relates to integrated circuit device testers, and more particularly to an apparatus and method for providing electrical connections between ball grid array (BGA) packaged integrated circuits under test and the integrated circuit device testers.

BACKGROUND OF THE INVENTION

Integrated circuit (IC) devices typically include an IC chip which is housed in a plastic, ceramic or metal "package". The IC chip includes an integrated circuit formed on a thin wafer of silicon. The package supports and protects the IC chip and provides electrical connections between the integrated circuit and an external circuit or system.

There are several package types, including ball grid arrays (BGAs), pin grid arrays (PGAs), plastic leaded chip carriers, and plastic quad flat packs. Each of the package types is typically available in numerous sizes. The package type selected by an IC manufacturer for a particular IC chip is typically determined by the size/complexity of the IC chip (i.e., the number of input/output terminals), and also in accordance with a customer's requirements.

Figure 1A:
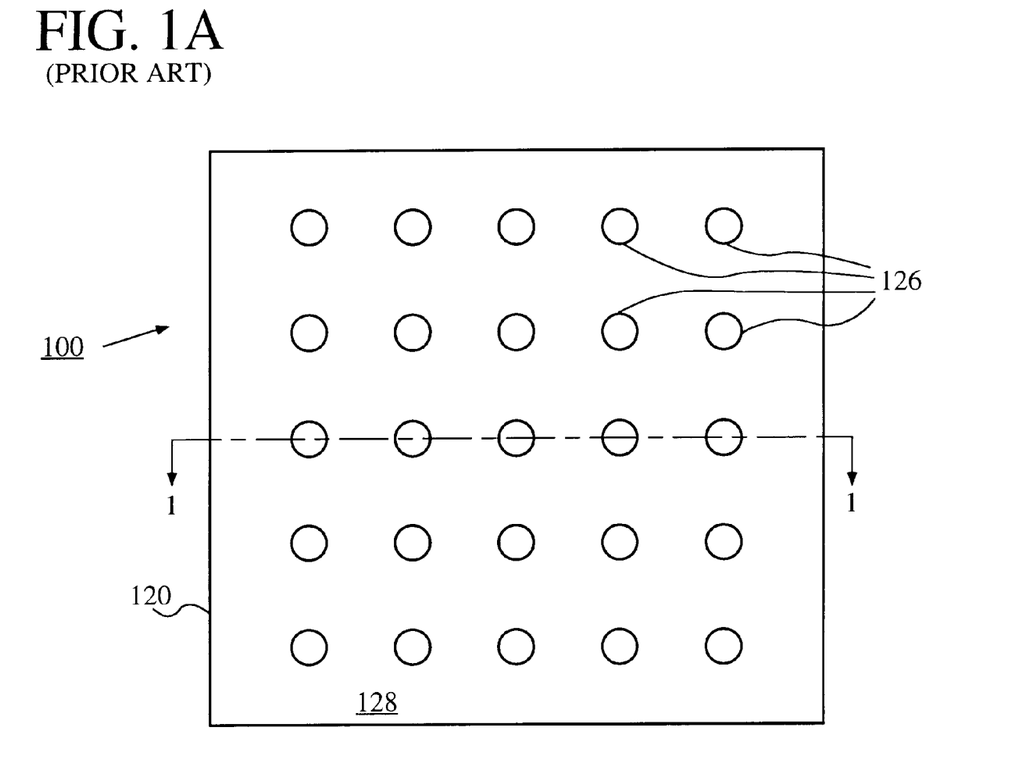
FIGS. 1A and 1B are bottom and sectional side views of a BGA IC.
Figure 1B:
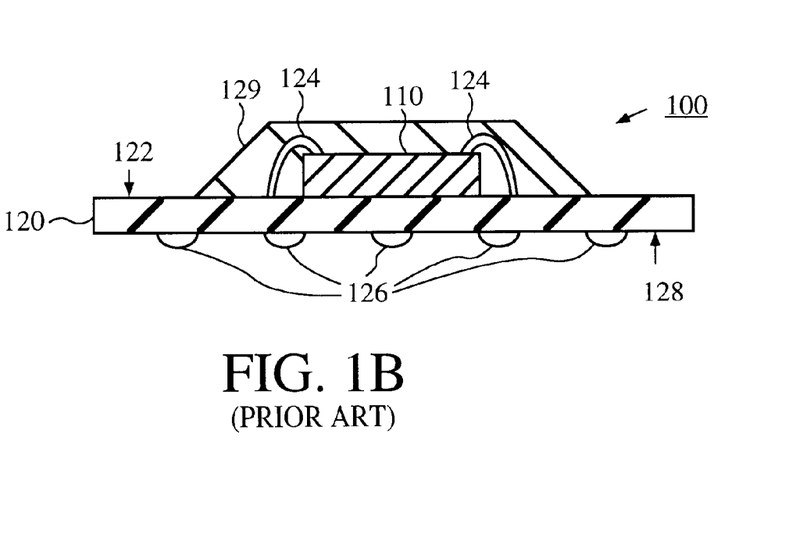

FIGS. 1A and 1B show bottom and side sectional views of a typical BGA IC 100 including an IC chip 110 mounted on an upper surface 122 of a package substrate 120. Electrical connections between bonding pads of IC chip 110 and conductive lines (not shown) formed on substrate 120 are provided by bond wires 124. A plurality (twenty-five shown) of solder balls (sometimes referred to as solder bumps) 126 extend from a lower surface 128 of the substrate 120 which are electrically connected to the conductive lines. Electrical signals travel between each solder ball 126 and one bonding pad of IC chip 110 along an associated conductive line and bond wire 124. A cover 129, such as a cap or "glob top", is placed or formed over IC chip 110 and bond wires 124 for protection.

IC testing systems are used by IC manufacturers to test their ICs before shipping to customers. IC testing systems typically include a device tester, a device handler and an interface structure. A device tester is an expensive piece of computing equipment which transmits test signals via tester probes to an interface structure. The interface structure transmits signals between the leads of an IC under test and the device tester. A device handler is an expensive precise robot for automatically moving ICs from a storage area to the interface structure and back to the storage area.

Figure 2A:
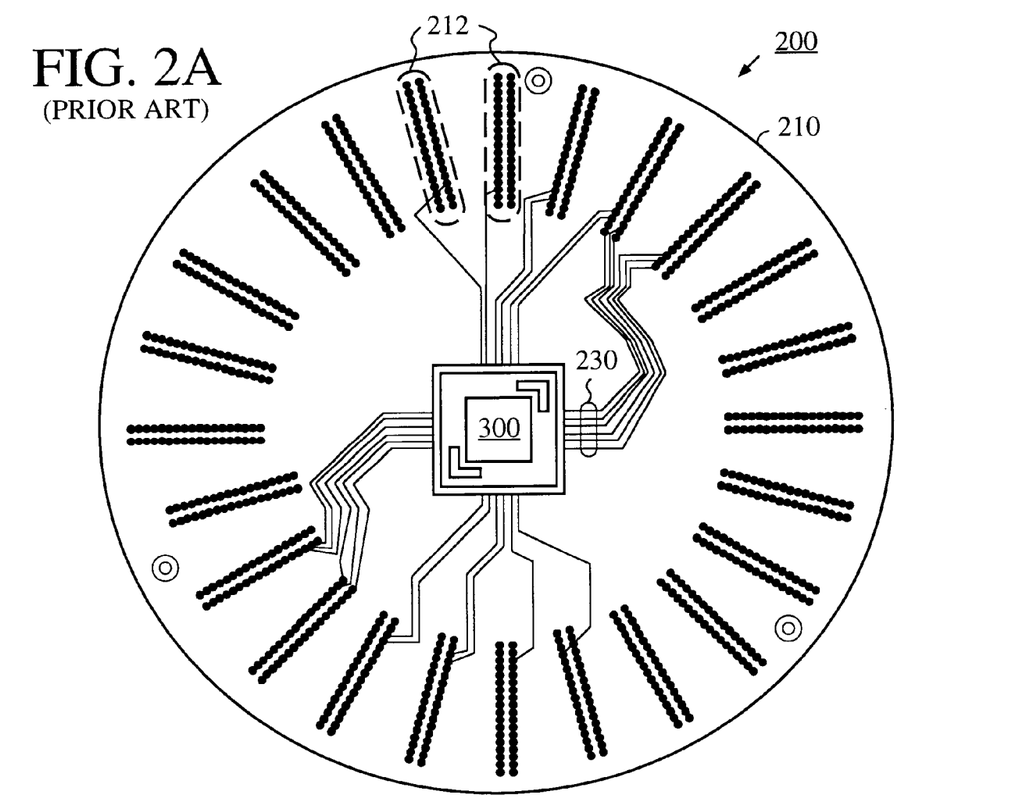
FIGS. 2A and 2B are top and side views of a conventional interface structure.
Figure 2B:
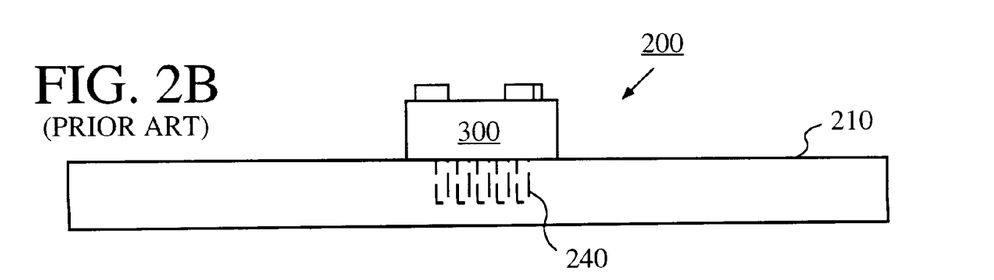

FIGS. 2A and 2B show side and top views of a conventional interface structure 200 which is used to test BGA ICs. Interface structure 200 includes a disk-shaped printed circuit board (PCB) 210 and a contactor 300. PCB 210 includes groups of outer vias 212 which are spaced around the perimeter of PCB 210. The arrangement of outer vias 212 shown in FIG. 2 must be used with the SC212 tester from Credence Systems Corporation. Outer vias 212 are mounted onto and receive male tester probes extending from the device tester (not shown). Outer vias 212 are connected by metal traces (conductive lines) 230 to inner sockets 240 located in a central test area. Contactor 300 is mounted over the central test area such that pin terminals (discussed in further detail below) which extend from a lower surface of the of contactor 300 are received in the sockets 240. After a BGA IC is mounted onto contactor 300 by the device handler, the test device transmits test signals through the male tester probes (not shown) to the outer vias 212, and along traces 230 to the sockets, and finally through the contactor 300 to the BGA IC under test. Similarly, return signals from the BGA IC are transmitted to the test device through contactor 300, sockets 240, traces 230 and outer vias 212.

Figure 3A:
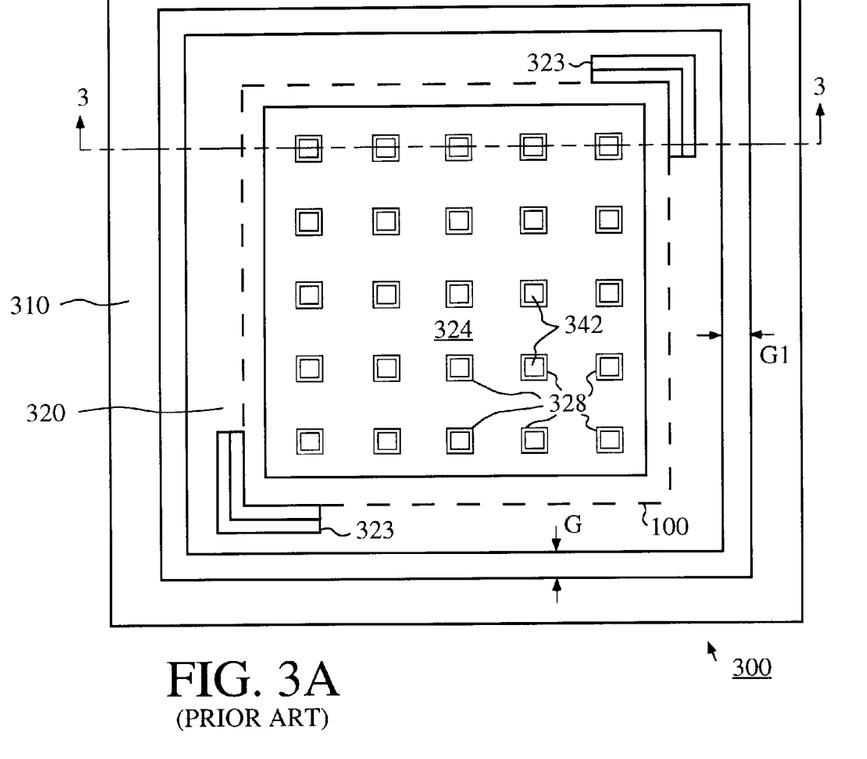
FIGS. 3A and 3B are top and sectional side views of a contactor of the conventional interface structure.
Figure 3B:
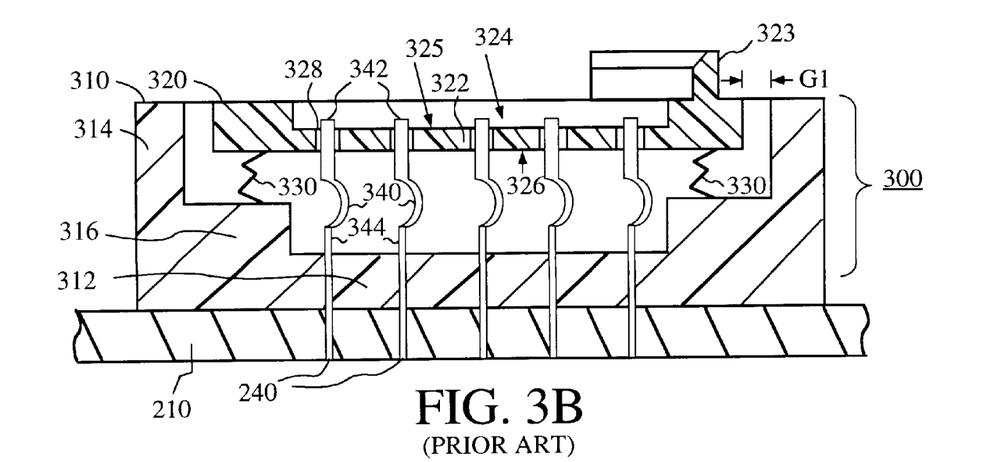

FIGS. 3A and 3B show a side sectional and top views of a contactor 300. Contactor 300 includes a housing 310 and a nesting member 320 movably mounted on housing 310 via support springs 330. Housing 310 includes lower wall 312, side walls 314 extending upward around the periphery of lower wall 312, and spring mounts 316 for receiving one end of the support springs 330. A peripheral edge of nesting member 320 is surrounded by outer side walls 314 of housing 310, thereby limiting horizontal movement of nesting member 320. However, a small gap G1 is provided between nesting member 320 and side walls 314 to allow vertical movement. Nesting member 320 includes a plate portion 322 positioned over the lower wall 312 of housing 310, and raised alignment walls 323 located at two corners of plate portion 322 which define a receiving area for BGA IC 100 (indicated in dashed lines). Plate portion 322 includes an indented area 324 having an upper surface 325, a lower surface 326, and a plurality of through-holes 328. Contactor 300 also includes a plurality of spring contacts 340 each having a C-shaped or S-shaped spring portion. Each spring contact 340 includes a contact portion 342 which extends through one of the through-holes 328 of nesting member 320, and a pin terminal 344 which extends through lower wall 312 of housing 310. When contactor 300 is mounted onto PCB 210, pin terminals 344 are received in sockets 240 formed in PCB 210.

Figure 4A:
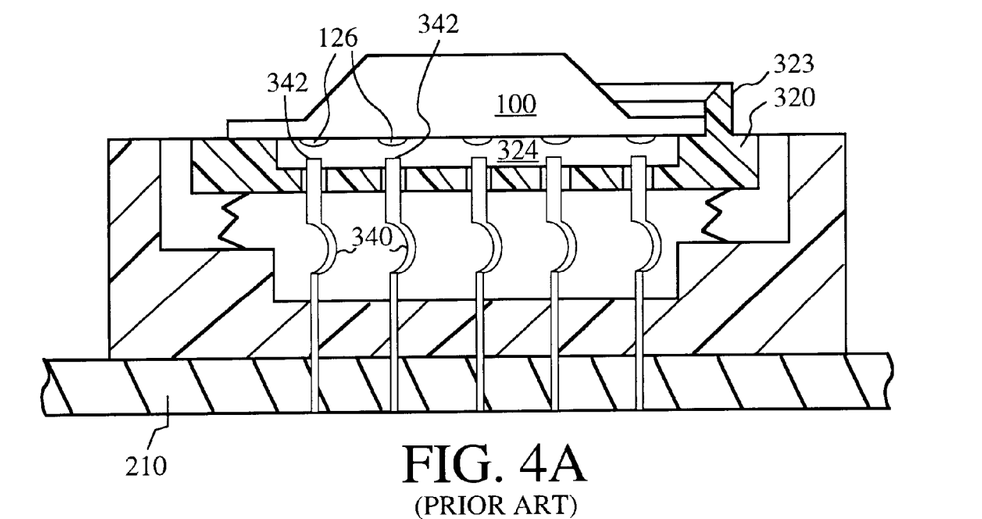
FIGS. 4A, 4B, 4C and 4D are sectional side views of the conventional contactor illustrating various operational conditions.
Figure 4B:
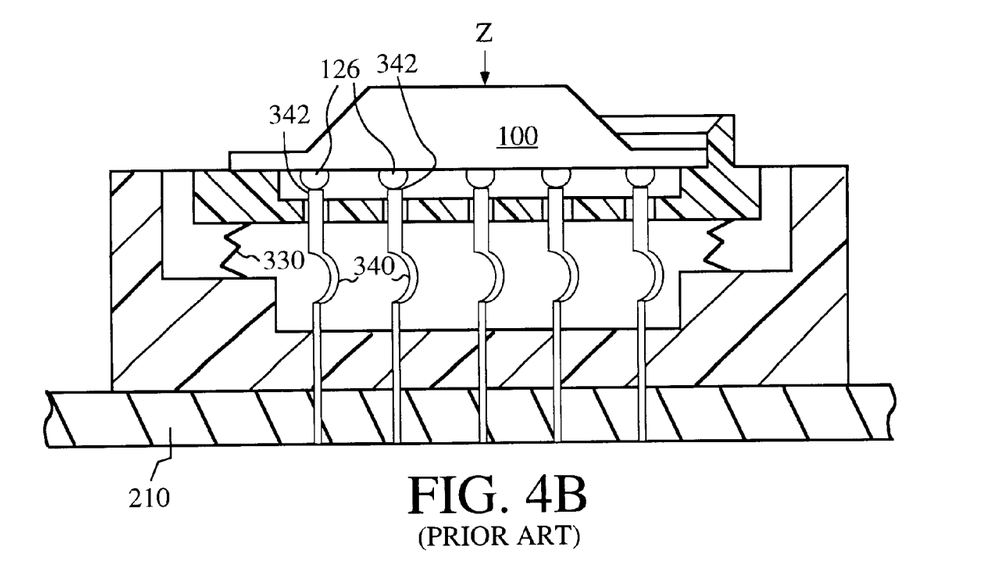

Operation of conventional interface structure 200 is described with reference to FIGS. 4A and 4B. As shown in FIG. 4A, a device handler (not shown) places a BGA IC 100 (shown in silhouette) onto nesting member 320 with solder balls 126 extending into indented area 324. BGA IC 100 is aligned on nesting member 320 by contact between the peripheral edge of substrate 120 and raised alignment walls 323 of nesting member 320. This alignment is intended to position solder balls 126 over the contact portions 342 of the plurality of spring contacts 340. Subsequently, as shown in FIG. 4B, the device handler presses BGA 100 downward (in the direction indicated by arrow Z) against the force exerted by support springs 330. As nesting member 320 displaces downward, solder balls 126 move toward and abut contact portions 342. Further downward force is absorbed by the C-shaped or S-shaped portion of spring contacts 340. When the BGA IC is properly aligned, electrical signals are then transmitted between PCB 210 and BGA IC 100 through contact between solder balls 126 and the contact portions 342 of the plurality of spring contacts 340. The device handler then removes BGA IC 100, and nesting member 320 is biased into its original position by support springs 330.

Several problems are associated with conventional interface structure 200, and in particular, to conventional contactor 300.

First, contactor 300 is very expensive (approximately $500 or more), and also very fragile. Pin terminals 344 of spring contacts 340 are often bent or damaged when contactor 300 is mounted to PCB 210. Straightening or replacing bent pin terminals 344 is extremely time consuming and, therefore, IC testing system operators often discard damaged contactors. Further, due to their simple construction, spring contacts 340 typically weaken and fail after a relatively low number of test procedures. As a result, device testing using conventional interface structures is expensive and often time consuming.

Figure 4C:
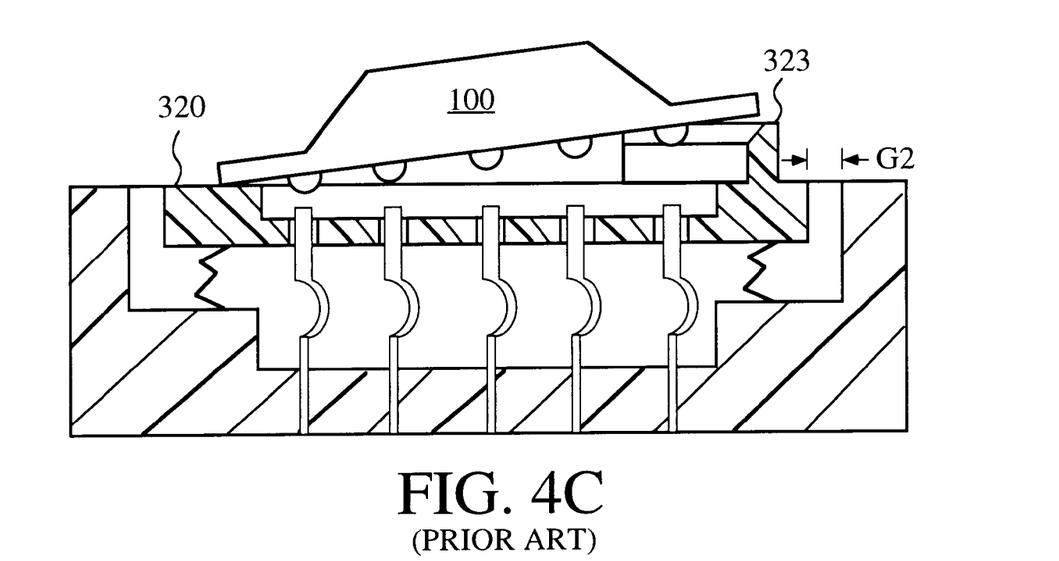

A second problem associated with conventional interface structure 200 is described with reference to FIG. 4C. Nesting member 320 can become misaligned for reasons of temperature variation, aging, or manufacturing variation. When interface structures are mounted on device testers, this process is typically performed at room temperature. Subsequent testing procedures are often performed at much higher temperatures. This temperature difference causes deformation of spring contacts 340, which shift nesting member 320 horizontally relative to housing 310 (indicated in FIG. 4c by gap G2 which is larger than gap G1 shown in FIG. 3B). Because the device handler is adjusted to mount BGA IC 100 in the original (room temperature) position of nesting member 320, this shift results in a relative misalignment between BGA IC 100 and nesting member 320. Alternatively, due to repeated lateral motion when IC devices 100 are inserted and removed from nesting member 320, nesting member 320 may become permanently biased to one side. Or due to manufacturing inaccuracy, nesting member 320 may be misaligned from the beginning. In some cases, as shown in FIG. 4C, BGA IC 100 is mounted such that one corner is located on top of alignment wall 323. When this occurs, subsequent downward pressure by the device handler often destroys BGA IC 100. Therefore, unless this problem is quickly recognized and corrected, significant product loss can occur. One possible solution to this problem is to widen alignment wall 323 and provide a long, tapered surface such that BGA ICs slide easily into position on nesting member 320. However, because the overall width of contactor 300 is typically restricted, and because a portion of this width is occupied by side walls 314 of housing 310, the width of nesting member 320 (and, therefore, alignment wall 323) is limited.

Figure 4D:
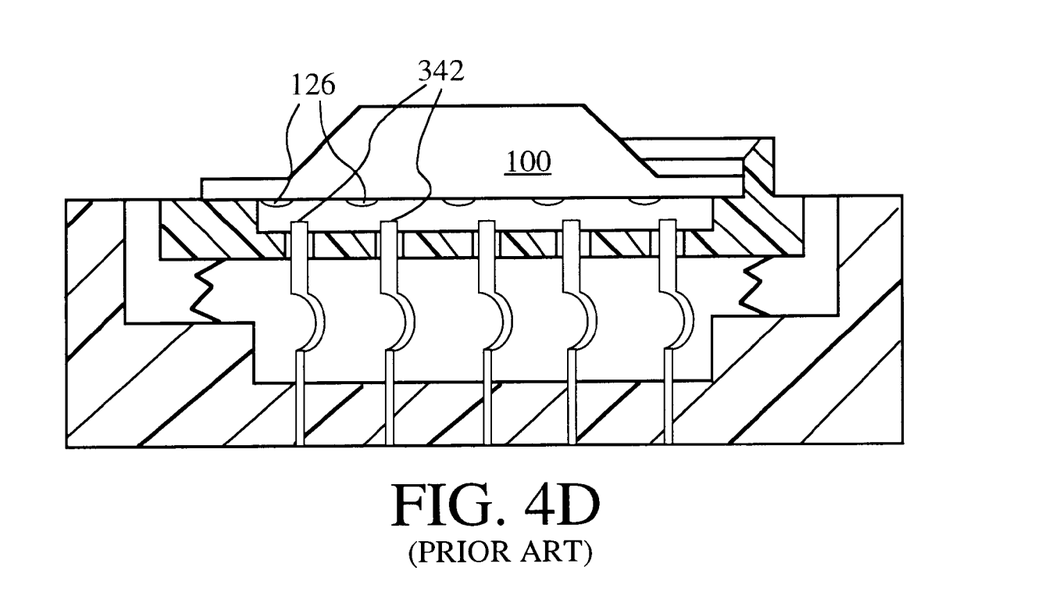

A third problem associated with conventional interface structure 200 is described with reference to FIG. 4D. In particular, alignment within nesting member 320 is based on the outer peripheral shape of BGA IC 100. If the position of solder balls 126 relative to the outer edge of substrate 120 is shifted during package manufacturing, the resulting misalignment can result in total misalignment between contact portions 342 and solder balls 126, as shown in FIG. 4D.

Figure 5A:
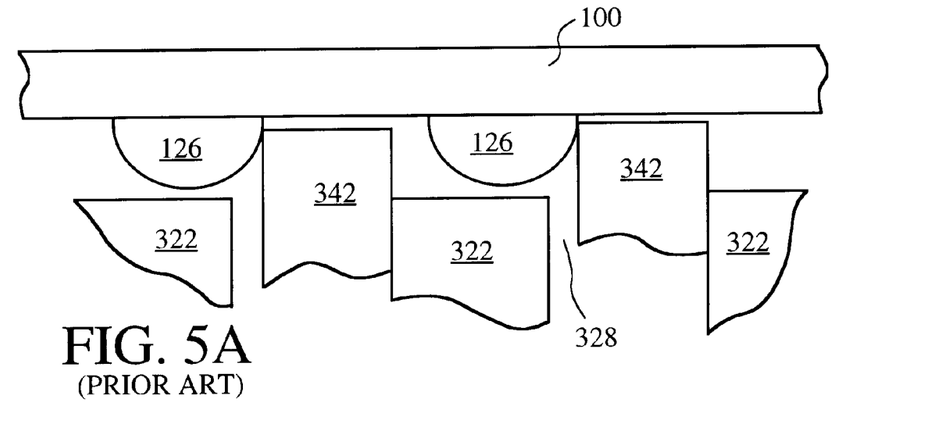
FIGS. 5A, 5B and 5C are enlarged side views of portions of the conventional contactor and a BGA IC.

Further, partial misalignment between balls 126 and contact portions 342 can cause BGA IC 100 to become wedged (stuck) to contact members 342. This situation is shown in FIG. 5A. As BGA IC 100 is pressed downward, the partial misalignment causes contact members 342 to slide along the outer sloped edge of solder balls 126, thereby causing deflection of contact members 342 against plate portion 322 surrounding through-holes 328. This wedging action can resist subsequent upward movement of BGA IC 100, thereby causing BGA IC 100 to become disengaged from the device handler, and causing a costly shut-down of the testing process.

Figure 5B:
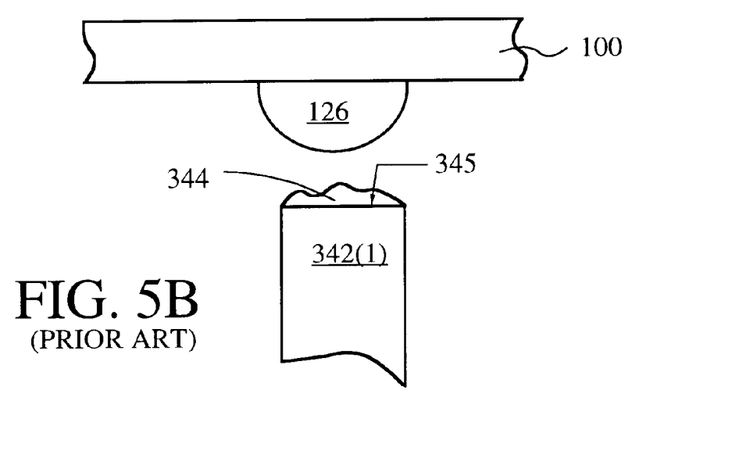
Figure 5C:
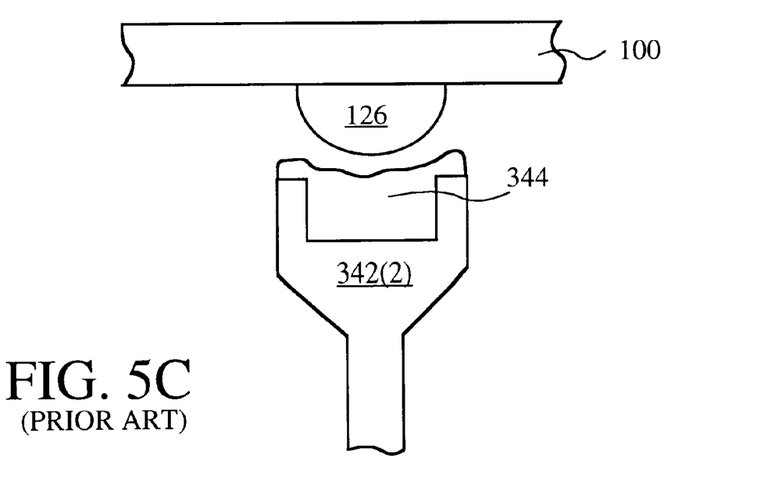

A final problem associated with conventional interface structure 200 is described with reference to FIGS. 5B and 5C. In particular, because of the various alignment problems associated with conventional interface structure 200 (discussed above) it is required to utilize a relatively wide contact portion 342(1) shown in FIG. 5B, or a cup-shaped contact portion 342(2) shown in FIG. 5C to assure contact with solder balls 126. However, the flat upper surface 343 of contact portion 342(1) serves as a ledge upon which tin-lead contamination 344 from the solder balls deposits over a period of time. Similarly, the cup-shaped contact portion 342(2) collects tin-lead contamination 344. Tin-lead contamination 344 imposes a resistance between contact portions 342(1) and 342(2) and solder ball 126, thereby causing incorrect test results and the erroneous discarding of good parts.

SUMMARY OF THE INVENTION

In accordance with a first aspect of the present invention, an interface apparatus includes spring-loaded pogo pins (spring probes) mounted directly onto a circuit board, and a contactor assembly mounted on the circuit board around and over the pogo pins. Each of the pogo pins includes a barrel (or body) which is soldered to the circuit board, and a plunger which is slidably mounted in the barrel and is biased by a spring away from a surface of the circuit board. The contactor assembly includes a contactor body mounted on the circuit board and having a central opening, a non-conductive plate mounted on the contactor body over the central opening for aligning the pogo pins, and a nesting member movably connected to the contactor body. The plungers of the pogo pins extend through openings formed in the non-conductive plate and have pointed tips located immediately below through-holes formed in the nesting member. When an IC is mounted on the nesting member and pressed downward, the contact terminals (solder balls) of the IC are contacted by the tips of the pogo pins, thereby providing electrical connection between the interface apparatus and the IC. Because the interface apparatus is constructed with standard pogo pins, reliability is greatly increased due to the durability of the pogo pins. In addition, misalignment of the nesting member due to thermal expansion is avoided. Finally, if one of the pogo pins is damaged, it is easily and inexpensively removed and replaced, thereby avoiding the cost of replacing an entire contactor.

In accordance with a second aspect of the present invention, an apparatus for interfacing between a device tester and an IC includes a contactor body having an upper surface and guide shafts extending from the upper surface, and a nesting member mounted over the contactor body and including guide holes which slidably receive the guide shafts such that the nesting member is restricted by the guide shafts to slide in a vertical direction. In addition, a resilient member is disposed between the upper surface of the contactor body and a lower surface of the nesting member for biasing the nesting member away from the contactor body. Because the nesting member is movably connected to the contactor body by the guide shafts, horizontal displacement of the nesting member relative to the contactor body is prevented, thereby avoiding misalignment between the contact terminals of the IC and pogo pins located under the nesting member. Further, a width of the nesting member may be maximized within a predetermined test area provided for the interface apparatus, thereby allowing a wide IC alignment structure on the nesting member for facilitating reliable seating of ICs in the nesting member.

In accordance with third and fourth aspects of the present invention, the upper surface of a nesting member is provided with chamfers in which the solder balls of a BGA IC become engaged, thereby providing an alignment method by which the BGA IC is aligned relative to test probes located below the nesting member on the basis of the solder ball position. This prevents misalignment between the plungers and the solder balls caused in the prior art structure when alignment is based on the peripheral edge of the BGA package substrate.

In accordance with a fifth aspect of the present invention, a method for testing a BGA IC includes the step of mounting the BGA IC onto a nesting member such that the solder balls are positioned over through-holes extending through an alignment plate of the nesting member, and then moving the nesting member toward a plurality of pogo pins such that pointed tips of the pogo pins extend through the through-holes and pierce the solder balls of the BGA IC. By piercing the solder balls using pointed pogo pins, reliable electrical contact is provided between the pogo pins and the solder balls, and contaminants deposited on the pointed tip are sloughed off of the tip when a subsequent solder ball is pierced, thereby achieving repeated good contact and preventing erroneous test results.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 6A:
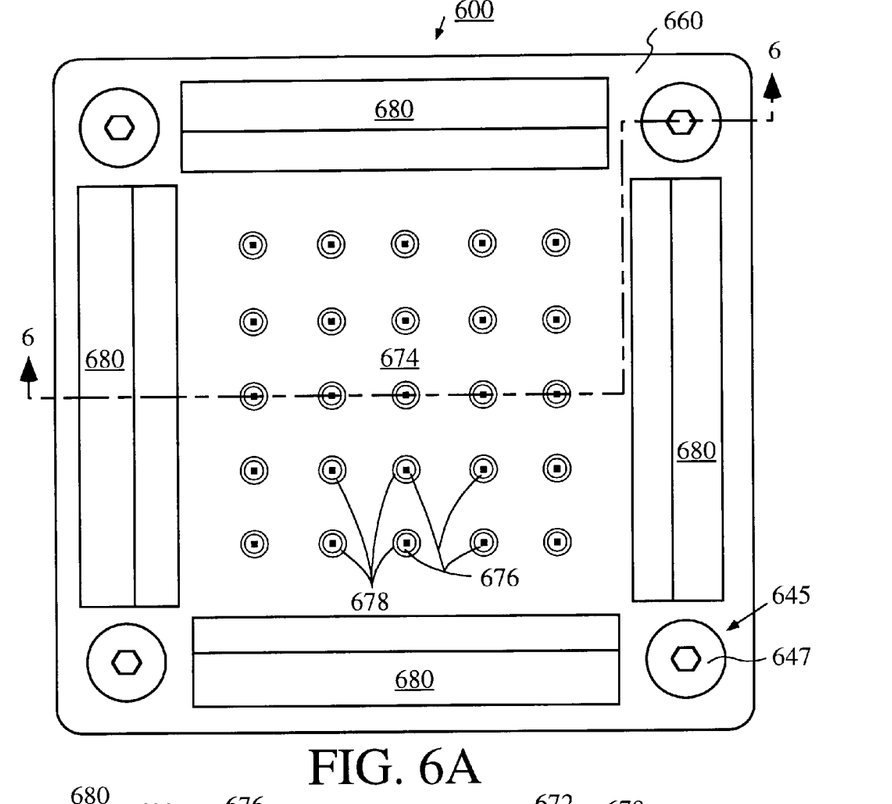
FIGS. 6A and 6B are top and sectional side views of an interface apparatus in accordance with the present invention.
Figure 6B:
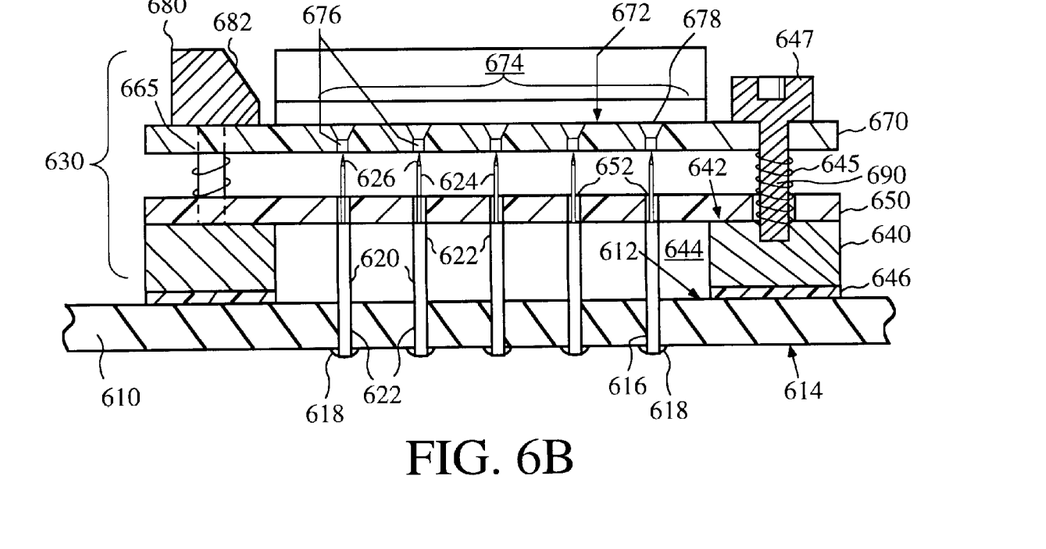

FIGS. 6A and 6B show an interface apparatus 600 in accordance with an embodiment of the present invention. Similar to the conventional interface apparatus 200 (discussed above), interface apparatus 600 is utilized with a device tester and a device handler to facilitate testing of ball grid array integrated circuit (BGA IC) devices, such BGA IC 100 (discussed above). As used herein, the term "BGA IC" refers to any product having solder balls or bumps for connecting the integrated circuit to external circuitry.

Interface apparatus 600 generally includes a printed circuit board (PCB) 610 and a contactor assembly 630.

PCB 610 is similar in construction to the conventional PCB 210 (as shown in FIG. 2A) in that PCB 610 includes outer (first) vias (corresponding to outer vias 212) for connection to the male test probes of a device tester or to a mother board, test area vias 616 for connection to spring probes (as discussed below), and conductive lines (corresponding to conductive lines 230) for carrying signals from the outer vias to the test area vias 616. PCB 610 includes an upper surface 612 and an opposing lower surface 614. In one embodiment, PCB 610 has a thickness (measured between upper surface 612 and lower surface 614) on the order of 3/8" as defined by a customer or by requirements of the tester.

FIG. 6B illustrates the test area of PCB 610 associated with a single contactor assembly 630. In alternative embodiments, two or more test areas may be formed on PCB 610. Further, a mother board/daughter board arrangement, such as that described by Fredrickson in co-owned and co-pending U.S. application Ser. No. 08/541,567, filed Oct. 10, 1995 [Docket X-160 US] entitled "System For Expanding Space Provided By Test Computer to Test Multiple Integrated Circuits Simultaneously", now U.S. Pat. No. 5,705,932, which is incorporated herein by reference, may be utilized to provide two or more test areas.

In accordance with a first aspect of the present invention, a plurality of standard spring-loaded pogo pins (spring probes) 620 are fixedly connected at one end to PCB 610. In particular, unlike conventional interface structure 200 in which spring contacts 340 are mounted in contactor 300, pogo pins 620 soldered directly to PCB 610 and extend through contactor assembly 630 to provide electrical connections to a BGA IC under test. Because of the low cost and proven durability of standard pogo pins 620, the reliability of interface apparatus 600 is greatly increased over conventional interface structures which rely on C-shaped or S-shaped wire springs mounted on the connector. In addition, horizontal misalignment of the nesting member due to thermal expansion is avoided because standard pogo pins 620 have a linear construction—that is, thermal expansion only occurs along the longitudinal axis of each pogo pin 620, so no horizontal force is applied to the nesting member due to this thermal expansion. Moreover, if one of the pogo pins 620 is damaged, it is easily and inexpensively removed from PCB 610 and replaced, thereby significantly reducing repair costs (in comparison to the cost of replacing a contactor 300).

Each pogo pin 620 includes a barrel 622 and a plunger 624 which is received in barrel 622. Plunger 624 is biased upward (away from PCB 610) by a spring (not shown) located inside of barrel 622. Each barrel 622 is received in a receptacle mounted in a conductive via 616 formed in a predetermined test area of PCB 610, and the lower end of each pogo pin 620 is fixedly adhered to the lower surface 614 of PCB 610 by solder 618 or another conductive adhesive, or is press-fit into the PCB. Each pogo pin 620 is formed from conductive materials, so signals are transmitted between plunger 624 and its associated outer via (similar to vias 212 of PCB 210) along conductive lines (not shown) which are formed on PCB 610. Spring-loaded pogo pins suitable for use in accordance with the present invention are produced by, for example, Interconnect Devices, Inc. of Kansas City, Kans., under part number SS-30-B.

Contactor assembly 630 generally includes a contactor body 640 mounted over the test area on upper surface 612 of PCB 610 determined by the pogo pin locations, a non-conductive plate 650 mounted on an upper surface of contactor body 640, and a nesting member 660 slidably mounted over non-conductive plate 650 and biased away from contactor body 640 by coil springs (resilient members) 690.

Contactor body 640 is mounted on PCB 610 and supports nesting member 660. Contactor body 640 includes four walls having an upper surface 642. The walls of contactor body 640 are formed into a generally square or rectangular frame which surrounds a central opening 644. Pogo pins 620 extend through central opening 644 of contactor body 640. Contactor body 640 is formed from machined aluminum or another rigid conductive or non-conductive material. If contactor body 640 is formed from a conductive material, a non-conductive spacer 646 may be mounted between contactor body 640 and PCB 610 to avoid electrical short-circuiting between the conductive lines of PCB 610 and contactor body 640.

Non-conductive plate 650 is mounted on upper surface 642 of contactor body 640 for aligning plungers 624 of pogo pins 620 to contact the solder balls (contact terminals) of an IC under test. In particular, non-conductive plate 650 extends over the test area of PCB 610 and defines a plurality of openings 652 arranged in a predetermined pattern such that one plunger 624 of an associated pogo pin 620 extends through and is aligned by an associated opening 652 of non-conductive plate 650. Non-conductive plate 650 may be formed from a rigid laminate such as GETEX available from General Electric Corp., a high performance polyimide, a nonconductive epoxy such as FR4 (also referred to as G-10), or Teflon™, or may be formed from other suitable non-conductive material.

In accordance with a second aspect of the present invention, four shoulder bolts (guide shafts) 645 extend slidably through guide holes 665 in nesting member 660 and down through holes formed in non-conductive plate 650 where they are screwed or otherwise fixedly attached to contactor body 640. The shoulders 647 at the upper ends of shoulder bolts 645 restrict upward movement of nesting member 660. A coil spring 690 is provided around the shaft of each shoulder bolt 645 for biasing nesting member 660 upwards from contactor body 640 against shoulder 647. Shoulder bolts 645 guide the vertical movement of nesting member 660 during the device testing procedure described below. In particular, shoulder bolts 645 prevent horizontal displacement of nesting member 660 relative to contactor body 640, thereby preventing misalignment between solder balls 126 of BGA IC 100 and pogo pins 620.

Nesting member 660 includes a non-conductive alignment plate 670, and IC alignment structures 680 located on an upper surface 672 of alignment plate 670. Alignment plate 670 includes a central IC receiving area 674 which is located over the test area of PCB 610, and defines a plurality of through-holes 676. Each through-hole 676 is positioned over the plunger 624 of one pogo pin 620. Four IC alignment structures 680 are preferably positioned around the central IC receiving area 674 and include slanted walls 682 which slope toward the central IC receiving area 674 for positioning gravity-feeding BGA ICs onto IC receiving area 674 of alignment plate 670. IC alignment structures 680 may be formed separately and mounted to alignment plate 670 using, for example, screws or adhesive. Alternatively, IC alignment structures 680 and alignment plate 670 may be machined from a single piece of, for example, vespel or other non-conductive material. Because guide shafts 645 restrict horizontal movement of nesting member 660, a width of nesting member 660 is not restricted, as in conventional contactor 300. As a result, IC alignment structures 680 may be significantly wider and have a larger sloped surface than those provided in conventional contactor 300, thereby facilitating reliable seating of BGA IC 100 in nesting member 660 during the device testing procedure.

In accordance with a third aspect of the present invention, upper surface 672 of alignment plate 670 is provided with a plurality of chamfers 678, each chamfer 678 being formed around one through-hole 676. Chamfers 678 are used to provide fine alignment of BGA ICs during the device testing procedure for contact with pogo pins 620. In particular, when BGA IC 100 is mounted on alignment plate 670, solder balls 126 of the BGA IC are gravity-fed into (i.e., become engaged with) chamfers 678, thereby aligning BGA IC 100 on the basis of solder balls 126. By providing chamfers 678 which align BGA ICs based on the position of the solder balls, the present invention avoids the misalignment problem caused by variations in the solder ball position relative to the peripheral edge of the BGA package substrate. Using the peripheral edge for alignment is a problem with the conventional contactor 300. The vertical dimension of contactor assembly 630 and the length of pogo pins 620 must cooperate to place the tips of pogo pins 620 slightly below alignment plate 670 when no pressure is applied to alignment plate 670.

The device testing procedure utilizing interface apparatus 600 will now be described with reference to FIGS. 7A, 7B and 7C.

Figure 7A:
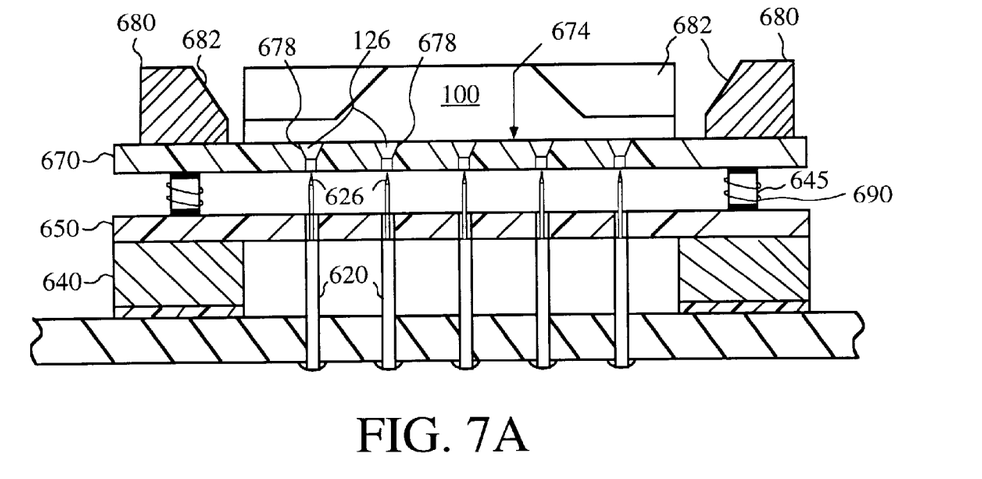
FIGS. 7A, 7B and 7C are sectional side views of the interface apparatus illustrating various operational conditions.

Referring to FIG. 7A, BGA IC device 100 is mounted onto nesting member 660 by a device handler (not shown). In particular, the device handler positions BGA IC device 100 over nesting member 660, and then releases BGA IC device 100 so that it falls onto nesting member 660. Each IC alignment structure 680 includes a relatively long slanted wall 682 which facilitates "rough" positioning by causing BGA IC 100 to slide into the central IC receiving area 674.

Subsequently, in accordance with a fourth aspect of the present invention, after BGA IC 100 enters the central IC receiving area 674 between alignment structures 680, each solder ball 126 becomes engaged with an associated chamfer 678, thereby providing "fine" alignment of BGA IC 100 relative to pogo pins 620. As shown in FIG. 7A, a small gap is provided between the outer peripheral edge of BGA IC device 100 and the inner edge of IC alignment structures 680, thereby providing a buffer for misalignments between solder balls 126 and the peripheral edge of BGA IC 100.

Figure 7B:
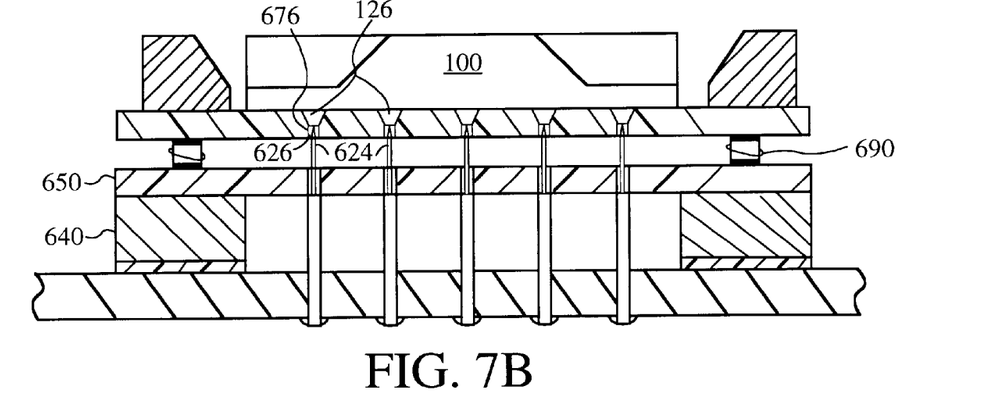

Referring to FIG. 7B, the device handler (not shown) then pushes nesting member 660 downward toward pogo pins 620 such that a tip 626 of each plunger 624 extends through an associated through-hole 676 and contacts one solder ball 126 of the BGA IC 100.

Figure 8A:
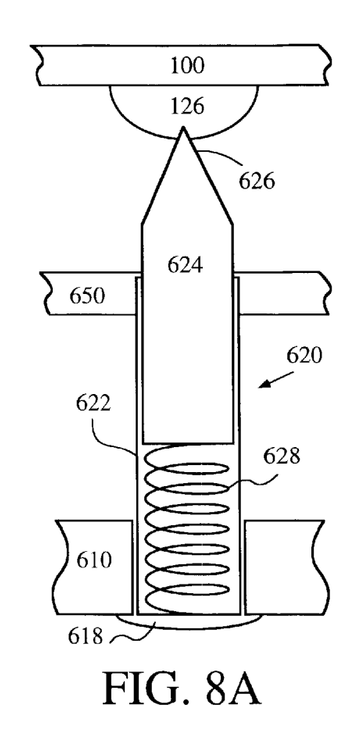
FIGS. 8A, 8B and 8C are enlarged side views of a pogo pin of the interface apparatus and a solder ball of a BGA IC shown in FIGS. 6A and 6B illustrating various operational conditions.
Figure 8B:
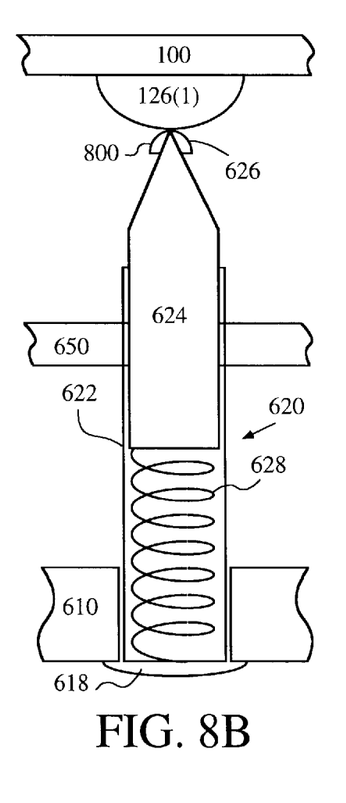

In accordance with a fifth aspect of the present invention, each tip 626 is a single-pointed tip which pierces the outer surface of the associated solder ball 126, as shown in FIG. 8A. Because tip 626 pierces solder ball 126, tip 626 is inserted beyond any oxidation or contaminants on the surface of solder balls 126, thereby providing reliable electrical contact between pogo pins 620 and solder balls 126. Further, if contaminants 800 adhere to tip 626 upon withdrawal of tip 626 from a first solder ball 126(1), as shown in FIG. 8B, the adhered contaminants 800(1) are deformed and sloughed off of tip 626 upon piercing a subsequent solder ball 126(2) (i.e., contaminant 800 is pushed along the tapered portion of tip 626 such that contaminant 800 is formed into an annular ring which eventually fractures and falls away). This facilitates reliable device testing by avoiding erroneous test results caused when contaminants build up on the surface of tip 626 and reduce the electrical contact between an interface apparatus and BGA IC device under test.

Figure 7C:
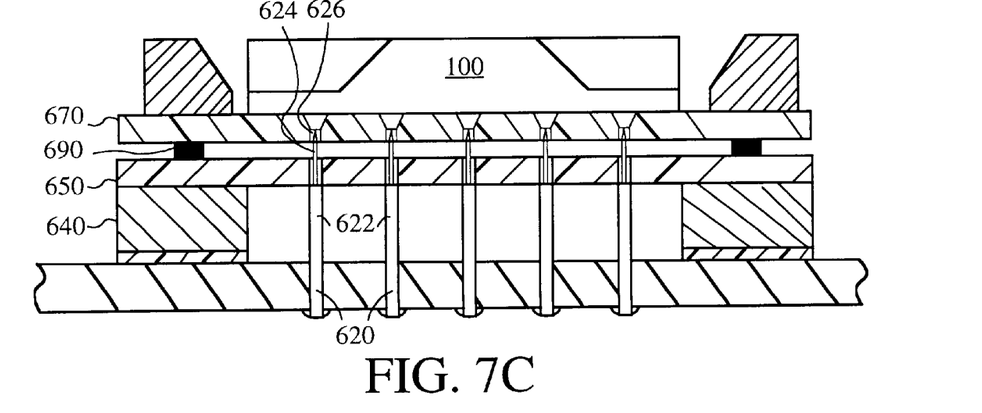
Figure 8C:
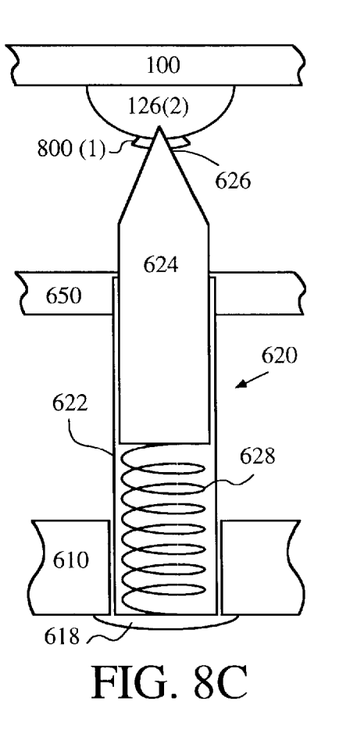

Referring to FIG. 7C, further downward movement of nesting member 660 and action of springs 628 (see FIG. 8C) causes compression of plungers 624 into their respective pogo pins 620. Downward movement of nesting member 660 is restricted by the upper surface of non-conductive plate 650 and/or the resilient members 690. Pogo pins 620 are selected such that the stroke length of plungers 624 is greater than their downward movement after contact with solder balls 126. This causes each pogo pin 620 to apply a substantially uniform pressure to each solder ball 126, and prevents premature failure of pogo pins 620 due to breakage.

When solder balls 126 of BGA IC 100 are connected to pogo pins 620 as shown in FIG. 7C, electrical test signals are then transmitted between PCB 610 and BGA IC 100 through the pogo pins 620. Upon completion of the test signal transmission, the device handler then removes BGA IC 100, and nesting member 660 is biased into the original position (shown in FIG. 7A) by coil springs 690.

Although the above-described embodiment of the present invention is designed for testing BGA packaged devices, several aspects of the present invention may be utilized to test other package types, such as Land Grid Array (LGA) packages currently available from Fujitsu Co. of Japan. For example, the first and second aspects, which incorporate pogo pins into the PCB and utilize guide shafts for aligning the nesting member, may be beneficially utilized in a LGA interface apparatus to overcome deficiencies associated with other commercially available sockets utilized for testing LGA packages devices.

The above description of an embodiment of the present invention is intended to be illustrative and not limiting. For example, in one possible alternative embodiment, walls 680 can be eliminated when a precision robot can place devices under test accurately enough that only the fine alignment of the chamfered holes 678 is needed to properly locate the solder balls for testing of the device. In another embodiment, double-tipped pogo pins, each having a spring-loaded upper tip as shown and a spring-loaded lower tip at the bottom end of the barrel, may be incorporated into a contactor body located between the nesting member and the PCB. In this alternative embodiment, the lower tip of each double-tipped pogo pin is received on a land provided on the PCB, and the upper tip is utilized in the manner described above.

Figure 8D:
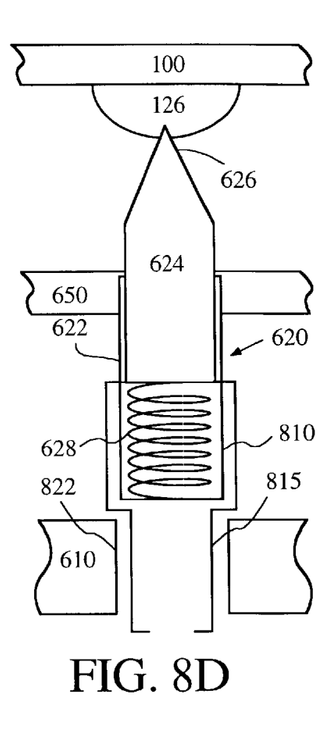
FIG. 8D is an enlarged side view of a pogo pin and receptacle of an alternative interface apparatus and a solder ball of a BGA IC.

In another embodiment illustrated in FIG. 8D, the pogo pins have only upper tips and the lower ends of pogo pins 620 are set into a receptacle that has been soldered into the PCB. This embodiment allows for easier replacement of a damaged pogo pin, and also avoids stressing the springs and walls of the pogo pins while the receptacle is being soldered or fitted into the PCB. Such a receptacle preferably includes a receiving cup 810 of diameter wide enough to receive the pogo pin for a press fit, and a narrow attaching tube 815 for inserting into the PCB. When replacement of the pogo pin is needed, a needle can be inserted from the lower surface of the PCB through attaching tube 815, and pressed against the lower end of the pogo pin 620 for removal of the pogo pin.

In another alternative embodiment, the coil spring 690 is replaced by a leaf spring, an elastomer, or other resilient member mounted between the lower surface of nesting member 660 and the upper surface of contactor body 640. Other alternative embodiments of this invention will be obvious to those skilled in the art in view of the above disclosure.

We claim:

1. An apparatus for interfacing between a device tester and an integrated circuit (IC) including a plurality of contact terminals, the apparatus comprising:
    a contactor body having an upper surface and a plurality of guide shafts fixedly attached to the upper surface;
    a nesting member including an alignment plate for receiving the IC, the nesting member defining a plurality of guide holes; and
    a resilient member disposed between the upper surface of the contactor body and the lower surface of the alignment plate;
    wherein each of the plurality of guide shafts extends slidably through one of the plurality of guide holes formed in the nesting member such that the nesting member is restricted by the guide shafts to slide in a vertical direction; and
    wherein the resilient member biases the nesting member away from the contactor body.

2. The apparatus according to claim 1, further comprising a plurality of pogo pins located below the nesting member, wherein the nesting member is movable along the guide shafts between a first position in which tips of the pogo pins are located below the alignment plate, and a second position in which the tips of the pogo pins extend into through-holes formed in the alignment plate such that the pogo pins provide electrical connection between contact terminals of the IC and the device tester.

3. The apparatus according to claim 2, further comprising a circuit board,
    wherein each of the plurality of pogo pins includes a barrel soldered to the circuit board, a plunger movably mounted in the barrel, and said tip located at an end of the plunger, and
    wherein the contactor body includes a plurality of walls surrounding the plurality of pogo pins.

4. The apparatus according to claim 1,
    wherein the nesting member further comprises an alignment structure formed around a peripheral edge of the alignment plate, the alignment structure including a slanted wall sloping toward the alignment plate such that the IC slides from the slanted wall onto the alignment plate of the nesting member, and
    wherein the upper surface of the alignment plate around each of the plurality of through holes is chamfered to provide fine alignment of the integrated circuit device within the nesting member.

5. An apparatus for interfacing between a device tester and an integrated circuit (IC) including a plurality of contact terminals, the apparatus comprising:
    a circuit board including a plurality of contacts for receiving signals from the device tester, a plurality of vias and a plurality of conductive lines connecting selected contacts with selected vias;
    a plurality of pogo pins, each of the pogo pins including a barrel received in an associated via of the circuit board, and a plunger slidably mounted in the barrel such that a tip of the plunger extends away from a surface of the circuit board; and
    a contactor assembly mounted on the circuit board, the contactor assembly including:
        a contactor body having a plurality of walls surrounding the pogo pins; and
        a nesting member movably connected to the contactor body and defining a plurality of through-holes;
    wherein the nesting member is mounted over the contactor assembly such that the tip of each plunger is aligned with an associated through-hole of the nesting member.

6. The apparatus according to claim 5, wherein the nesting member is movable relative to the contactor body between a first position in which the tips of the pogo pins are located below the nesting member, and a second position in which the tips of the pogo pins extend into the through-holes formed in the nesting member.

7. The apparatus according to claim 5,
    wherein the nesting member further comprises an alignment plate defining said through-holes, and an alignment structure formed around a peripheral edge of the alignment plate, the alignment structure including a slanted wall sloping toward the alignment plate such that the IC slides from the slanted wall onto the alignment plate of the nesting member, and
    wherein the upper surface of the alignment plate around each of the plurality of through holes is chamfered to provide fine alignment of the integrated circuit device within the nesting member.

8. The apparatus according to claim 5, further comprising a non-conductive plate mounted between the contactor body and the nesting member, the non-conductive plate including a plurality of holes, wherein each of the pogo pins extends through one of the holes formed in the non-conductive plate.

9. An apparatus for interfacing between a device tester and a ball grid array integrated circuit (BGA IC) including a plurality of solder balls, the apparatus comprising:

a plurality of pogo pins, each pogo pin including a barrel and a plunger movably disposed in the barrel, each plunger having a tip;

a contactor body having a plurality of walls surrounding the plurality of pogo pins;

a nesting member movably mounted on the contactor body, the nesting member including an alignment plate having a lower surface facing the contactor body and an upper surface facing away from the contactor body, the alignment plate defining a plurality of through-holes extending between the lower and upper faces, each of the through-holes being located over the plunger of one of the plurality of pogo pins;

wherein each of the plurality of through-holes includes a chamfer formed in the upper surface of the alignment plate such that when the BGA IC is placed on the nesting member, each of the solder balls is received in one of the chamfers, thereby aligning the BGA IC for contact with the plungers of the pogo pins.

10. The apparatus according to claim 9, wherein the nesting member is movable between a first position in which tips of the plungers are located below the alignment plate, and a second position in which the tips of the plungers extend into through-holes formed in the alignment plate.

11. The apparatus according to claim 10, further comprising a circuit board defining a plurality of vias, wherein the barrel of each of the plurality of pogo pins is received in one of the plurality of vias formed in the circuit board.

12. The apparatus according to claim 9, wherein the nesting member further comprises an alignment structure formed around a peripheral edge of the alignment plate, the alignment structure including a slanted wall sloping toward the alignment plate such that the BGA IC slides from the slanted wall onto the alignment plate of the nesting member.

13. A method for testing a ball grid array integrated circuit (BGA IC) including a plurality of solder balls, the method comprising the steps of:

positioning the BGA IC on a nesting member such that the solder balls are received in chamfers formed around through-holes extending through an alignment plate of the nesting member, and moving the nesting member toward a plurality of pogo pins such tips of the pogo pins extend through the through-holes and contact the solder balls of the BGA IC.

14. The method according to claim 13, wherein the nesting member further comprises an IC alignment structure surrounding the alignment plate, the alignment structure including a slanted wall which slopes toward the alignment plate, wherein the step of positioning the BGA IC on the nesting member comprises releasing the BGA IC onto the alignment structure such that the BGA IC slides on the slanted wall and is gravity-fed onto the alignment plate.

15. The method according to claim 14, wherein the step of moving the nesting member comprises pressing the BGA IC against the alignment plate.

16. A method for testing a ball grid array integrated circuit (BGA IC) including a plurality of solder balls, the method comprising the steps of:

mounting the BGA IC onto a nesting member such that the solder balls are positioned over through-holes extending through an alignment plate of the nesting member, and moving the nesting member toward a plurality of pogo pins such that pointed tips of plungers of the pogo pins extend through the through-holes and pierce the solder balls of the BGA IC, wherein the pointed tip of each plunger is a single-pointed tip.

17. The method according to claim 16, wherein the nesting member further comprises an IC alignment structure surrounding the alignment plate, the alignment structure including a slanted wall which slopes toward the alignment plate, wherein the step of mounting the BGA IC on the nesting member comprises releasing the BGA IC onto the alignment structure such that the BGA IC slides on the slanted wall and is gravity-fed onto the alignment plate.

18. The method according to claim 17, wherein the step of moving the nesting member comprises pressing the BGA IC against the alignment plate.

* * * * *